United States Patent
Ting et al.

(10) Patent No.: US 8,084,769 B2
(45) Date of Patent: Dec. 27, 2011

(54) TESTKEY DESIGN PATTERN FOR GATE OXIDE

(75) Inventors: Shyh-Fann Ting, Tai-Nan (TW);
 Sheng-Hao Lin, Hsin-Chu Hsien (TW);
 Chien-Hsing Lee, Taipei County (TW);
 Da-Ching Chiou, Chiayi (TW);
 Sun-Chin Wei, Tainan County (TW);
 Min-Yi Chang, Tainan (TW);
 Cheng-Tung Huang, Kao-Hsiung (TW);
 Tung-Hsing Lee, Hsin-Chu (TW);
 Tzyy-Ming Cheng, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 715 days.

(21) Appl. No.: 11/675,635

(22) Filed: Feb. 16, 2007

(65) Prior Publication Data
 US 2008/0197351 A1  Aug. 21, 2008

(51) Int. Cl.
 *H01L 23/544* (2006.01)
 *H01L 21/66* (2006.01)
(52) U.S. Cl. ........... 257/48; 257/E23.179; 257/E21.524; 324/763.01
(58) Field of Classification Search .................... 257/48, 257/E23.179, E21.521–E21.524; 324/763, 324/765, 763.01
 See application file for complete search history.

(56) References Cited

U.S. PATENT DOCUMENTS

| | | | | |
|---|---|---|---|---|
| 5,304,925 A | * | 4/1994 | Ebina | 324/769 |
| 5,821,766 A | * | 10/1998 | Kim et al. | 324/769 |
| 5,977,558 A | * | 11/1999 | Lee | 257/48 |
| 6,521,910 B1 | * | 2/2003 | Lin | 257/48 |
| 2003/0090285 A1 | * | 5/2003 | Sher et al. | 324/763 |
| 2006/0113533 A1 | * | 6/2006 | Tamaki et al. | 257/48 |

OTHER PUBLICATIONS

Hung-Der Su, et al., "A Floating Well Method for Exact Capacitance-Voltage Measurement if Nano Technology", IEEE Teansactions on Electron Devices, col. 50, No. 6, Jun. 2003, pp. 1543-1544.
Jung-Suk Goo, et al., "Extending Two-Element Capacitance Extraction Method Toward Ultraleaky Gate Oxides Using a Short-Channel Length", IEEE Electron Device Letters. vol. 25, No. 12, Dec. 2004, pp. 819-821.
Jurriaan Schmitz et al., "Test Structure Design Considerations for RF-CV Measurements on Leaky Dielectrics", May 2004, p. 150-154, vol. 17, No. 2, IEEE Transactions on Semiconductor Manufacturing.
Kevin J. Yang et al., "MOS Capacitance Measurements for High-Leakage Thin Dielectrics", Jul. 1999, p. 1500-1501, vol. 46, No. 7, IEEE Transactions on Electron Devices.

* cited by examiner

*Primary Examiner* — Colleen Matthews
(74) *Attorney, Agent, or Firm* — Winston Hsu; Scott Margo

(57) ABSTRACT

A testkey design pattern includes a least one conductive contact, at least one conductive line of a first width vertically and electrically connected to the conductive contact, and at least one pair of source and drain respectively directly connected to each side of the conductive line. The pair of source and drain and part of the conductive line of a first length directly connected to the source and drain form an electronic device. The testkey design patterns are advantageous in measuring capacitance with less error and for better gate oxide thickness extraction.

10 Claims, 3 Drawing Sheets

US 8,084,769 B2

TESTKEY DESIGN PATTERN FOR GATE OXIDE

BACKGROUND OF THE INVENTION

1. Field of the Invention

The present invention relates to a test pattern design. In particular, the present invention relates to an ideal test key design for gate oxide thickness extraction.

2. Description of the Prior Art

The gate oxide capacitance-voltage (CV) curve provides many essential fundamentals to oxide thickness extraction, mobility calculation, metallurgical channel length determination and interface trap characterization, which are the critical parameters of advanced CMOS technology development. However, as the critical dimension decreases, the oxide thickness is aggressively scaled down (~2.0 nm) for advanced ultra-thin oxide process development so the measured CV curve is distorted due to exponentially increasing gate leakage current and series parasitic resistance.

The following equation predicts the error ratio of the measured capacitance and the real capacitance:

$$C_m = C_{inv}/\{1+(R_s)/(R_p)\}^2$$

$C_{inv}$: real capacitance/ideal capacitance
$C_m$: measured capacitance
$R_p$: total resistance of gate oxide
$R_s$: $R_1$(poly resistance)+$R_2$ (gate channel resistance)+$R_3$ (contact and metal resustance)

It is accordingly concluded that in order to render the $C_m$ value approach to the $C_{inv}$ value as much as possible, either increasing the $R_p$ or decreasing the Rs will do. To solve this issue, several different solutions are known.

In "A Floating Well Method for Exact Capacitance-Voltage Measurement of Nano Technology," Hung-Der Su et al., IEEE Trans. Electron Device, Vol. 50, No. 6, p.p. 1543-1544, 2003, it mentions a two-element approach with smaller test pattern (25 μm² with 0.4 pF total capacitance). However, even a tiny 20 fF parasitic capacitance would cause undesirable error on oxide thickness extraction.

In "Extending Two-Element Capacitance Extraction Method Toward Ultraleaky Gate Oxides Using a Short-Channel Length," Jung-Suk Goo et al., IEEE Electron Device Letters, Vol. 25, No. 12, p.p. 819-821, 2004, it proposes using gate length shorter than 0.2 μm in parallel model for a lower channel resistance. Nevertheless it is easily understood that in practice even a 10 nm gate length variation caused by any possible imperfection could still lead 5%, an unacceptable error on oxide thickness extraction.

Therefore, a better approach is still required to minimize the error of measured thickness from process-induced gate area variation and parasitic capacitance.

SUMMARY OF THE INVENTION

The present invention in one aspect provides a testkey design pattern to meet the above-mentioned demand. The testkey design pattern of the present invention includes a conductive contact, a plurality of parallel conductive lines of a first width vertically and electrically connected to the conductive contact, and a plurality pairs of sources and drains respectively directly connected to each side of the conductive line, each pair of source and drain and part of the conductive line of a first length directly connected to the source and drain form an electronic device, and the electronic devices form an n*m array. The n and m each represents the line number and the row number of the array.

Because the electronic devices form an n*m array, they are an ensemble to reduce the total resistance for the parallel effect and therefore increase the accuracy of the measurement.

The present invention in another aspect provides a testkey design pattern to meet the above-mentioned demand. The testkey design pattern of the present invention includes: a first conductive contact, at least one conductive line of a first width vertically and electrically connected to the first conductive contact, a second conductive contact vertically and electrically connected to the conductive line, and at least one pair of source and drain respectively directly connected to each side of the conductive line. The pair of source and drain and part of the conductive line of a first length directly connected to the source and drain form an electronic device.

Because the electronic device is simultaneously connected to both the first conductive contact and the second conductive contact, two conductive contacts together averagely decrease 50% of the total resistance, and therefore increase the accuracy of the measurement.

The present invention provides two different approaches, i.e. the array arrangement of the electronic devices and two conductive contacts for the electronic devices, to decrease the ratio of $(R_s)/(R_p)$ so as to satisfy the requirement of less error in $C_m$ measurement without scarifying precise calibration, equipment cost or other crucial factors and therefore increase the accuracy of the measured $C_m$ values.

These and other objectives of the present invention will no doubt become obvious to those of ordinary skill in the art after reading the following detailed description of the preferred embodiment that is illustrated in the various figures and drawings.

DETAILED DESCRIPTION

The present invention provides better testkey design patterns for measuring $C_m$ values with less error and for better gate oxide thickness extraction.

Figure 1:
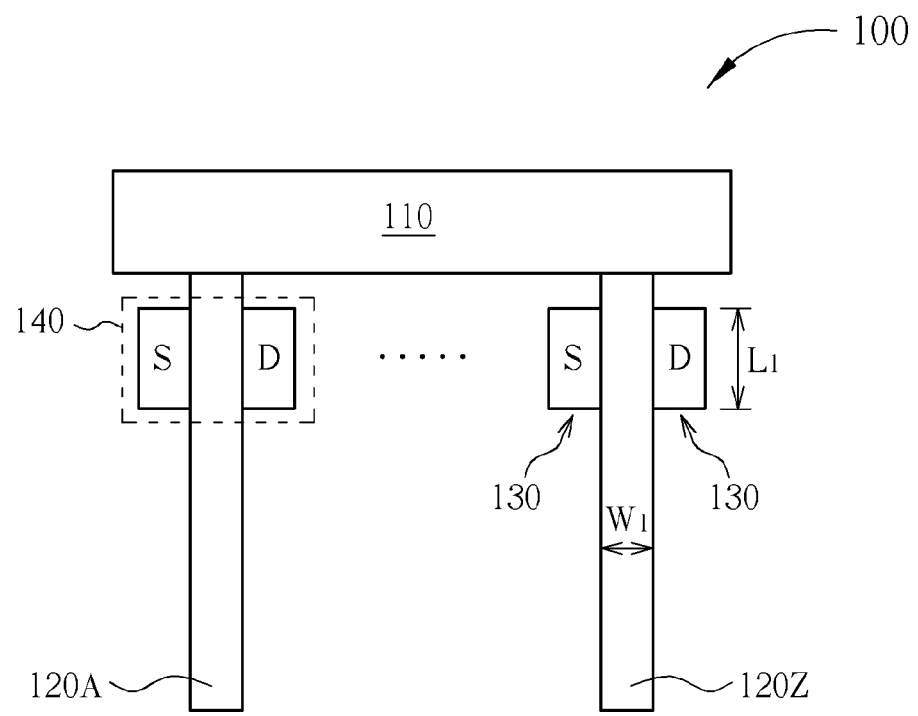
FIG. 1 illustrates the first preferred embodiment of the testkey design pattern of array type of the present invention.

In the first preferred embodiment, the present invention provides a testkey design pattern of array type to meet the above-mentioned demand, as shown in FIG. 1. The testkey design pattern 100 includes a conductive contact 110, a plurality of parallel conductive lines 120 such as 120A and 120Z of a first width, and a plurality pairs of sources and drains 130 respectively directly connected to each side of the conductive line 120. The testkey design pattern 100 may be on the scribe line or on the chip, preferably on the scribe line.

The conductive contact 110 is useful in providing conductive contact for $C_m$ measurement. For the nature of conductivity, the conductive contact 110 may include a material such as silicon, poly-Si for example, and metal. Similarly, the conductive lines 120 may include a material such as silicon, poly-Si for example, or a metal.

The parallel conductive lines 120 are vertically and electrically connected to the conductive contact 110 and have a first width $W_1$. The first width $W_1$ is preferable between 0.2-7 μm. If the first width $W_1$ is larger than 7 μm, it may increase the total resistance. On the other hand, if the first width $W_1$ is smaller than 0.2 μm, it would tolerate less fabrication errors.

At least one pair of source and drain 130 is respectively and directly connected to each side of the conductive line 120. Each pair of source and drain 130 and part of the conductive line 120 of a first length $L_1$ which is directly connected to the source and drain form an electronic device 140. Preferably, the sources and drains 130 are symmetrically connected to each side of the conductive line 120 as shown in FIG. 1. Collectively, the electronic devices 140 form an n*m array. The n and m each represents the line number and the row number of the array. For example, n and m may be independently greater than 2. In a more preferred embodiment, n equals to m.

In one preferred embodiment of the present invention, the total gate area ($W_1$*$L_1$*n*m) may be larger than 100 μm² for reducing the impact of the parasitic capacitance. In another preferred embodiment of the present invention, the ratio of $L_1$/$W_1$ may be less than 5 for minimizing the poly series resistance impact on CV curve.

Because the electronic devices 140 form an n*m array, they are an ensemble to reduce the total resistance for the parallel effect and therefore increase the accuracy of the measured values.

Figure 2:
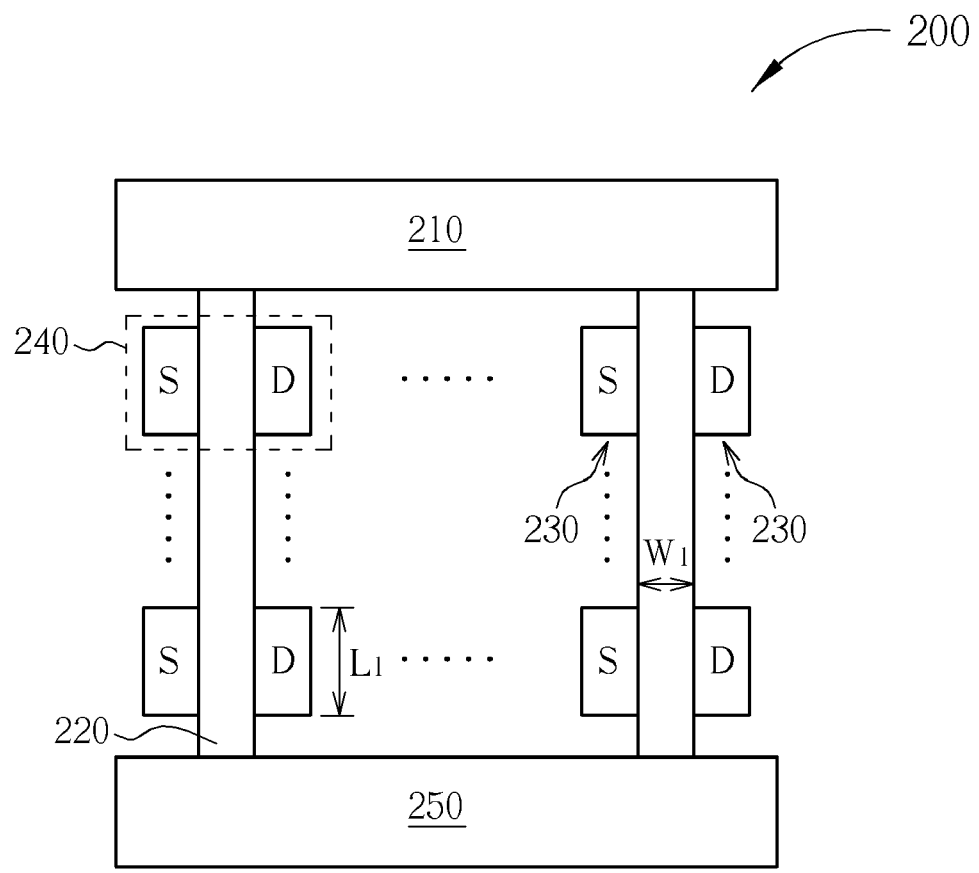
FIG. 2 illustrates the second preferred embodiment of the testkey design pattern of two-end-contact type of the present invention.

In the second preferred embodiment, the present invention provides a testkey design pattern of two-end-contact type to meet the above-mentioned demand, as shown in FIG. 2. The testkey design pattern 200 includes a first conductive contact 210 and a second conductive contact 250, at least one conductive line 220 of a first width vertically and electrically connected to the first conductive contact 210 and the second conductive contact 250, and at least one pair of source and drain 230 respectively directly connected to each side of the conductive line 220. The pair of source and drain 230 and part of the conductive line 220 of a first length are directly connected to the source and drain form an electronic device 240. The testkey design pattern of the present invention may be on the scribe line or on the chip, preferably on the scribe line.

The first conductive contact 210 and the second conductive contact 250 are advantageous in more accurate $C_m$ measurement due to less resistance. Because the two-end-contact type provides two current paths instead of one as shown in the first embodiment, the two-end-contact type may averagely decrease the total resistance by about 50%, which allows less $R_s$ value as explained before and results in more accurate $C_m$ measurement. For the nature of conductivity, the first conductive contact 210 and the second conductive contact 250 may independently include a material such as silicon, or a metal. Silicon may be a poly-Si.

Similarly, the conductive line 220 may include a material such as silicon, poly-Si for example, or a metal. The conductive 220 line is vertically and electrically connected to both the first conductive contact 210 and the second conductive contact 250 and has a first width $W_1$. The first width $W_1$ is preferable between 0.2-7 μm. If the first width $W_1$ is larger than 7 μm, it may negatively increase the total resistance. On the other hand, if the first width $W_1$ is smaller than 0.2 μm, it would allow less fabrication errors. In one preferred embodiment, if there are more than one conductive lines present, conductive lines 220A and 220Z for example, they may be arranged to be parallel to each other, as shown in FIG. 2.

At least one pair of source and drain 230 is respectively and directly connected to each side of the conductive line 220. Each pair of source and drain 230 and part of the conductive line of a first length $L_1$ which is directly connected to the source and drain 230 form an electronic device 240. Preferably, the source and drain 230 are symmetrically connected to each side of the conductive line 220 as shown in FIG. 2. In another preferred embodiment, there may be more than one electronic devices 240 and the electronic devices 240 collectively form an n*m array. The n and m each represents the line number and the row number of the array. For example, n and m may be independently greater than 2. In a more preferred embodiment, n equals to m.

In still another preferred embodiment of the present invention, the total gate area ($W_1$*$L_1$*n*m) may be larger than 100 μm² for reducing the impact of the parasitic capacitance. In yet another preferred embodiment of the present invention, the ratio of $L_1$/$W_1$ may be less than 5 for minimizing the poly series resistance impact on CV curve.

Figure 3:
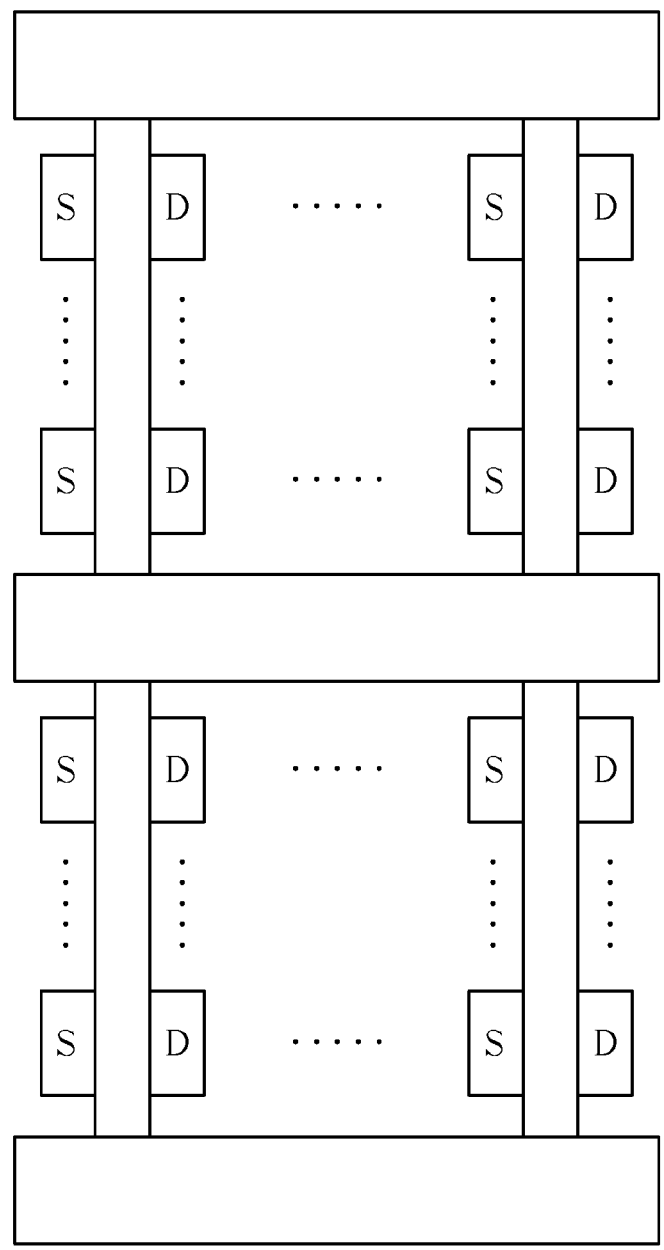
FIG. 3 illustrates a variation of the testkey design pattern of two-end-contact type of the present invention.

Based on the principle of the two-end-contact type, there may be other variations. For example, the testkey design pattern of the present invention may include two or more conductive contacts and the conductive lines are arranged between the conductive contacts, as shown in FIG. 3.

Because the electronic device is simultaneously connected to both the first conductive contact and the second conductive contact, two conductive contacts together averagely decrease 50% of the total resistance, and therefore increase the accuracy of the measured values.

EXAMPLES

The present invention provides the following comparative example and the working examples for the illustration of the advantages of the present invention.

| Example | Dimension $W_1$ * $L_1$ * No. | $R_p$ | $R_1$ | $R_2$ | $R_3$+ | $R_s$ |
|---|---|---|---|---|---|---|
| Comparative | 10 * 40 * 1 | 2880.0 | 16.00 | 75.65 | 1.00 | 92.65 |
| Working 1 | 5 * 5 * 25 | 1843.2 | 0.16 | 11.65 | 1.00 | 12.81 |
| Working 2 | 2 * 2 * 400 | 720.0 | 0.01 | 0.72 | 1.00 | 1.73 |
| Working 3 | 2 * 2 * 200 | 1440.0 | 0.02 | 1.44 | 1.00 | 2.46 |

1. No. = n * m
2. +For the reason of simplicity, all $R_3$ are assumed to be 1.00.

It is understood from the comparison of the above data that the more the devices, the less the total resistance. The testkey design patterns of the present invention provide better approaches for measuring $C_m$ values with less error and for better gate oxide thickness extraction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testkey design pattern, comprising:
   a first conductive contact;
   at least two conductive lines of a first width vertically and electrically connected to said first conductive contact;
   a second conductive contact vertically and electrically connected to said at least two conductive lines; and
   a plurality of electronic devices forming an n*m array, n and m represent a line number and a row number of said array, wherein m is greater than 2;
   wherein each of said plurality of electronic devices includes a source, a drain, and a portion of one of the at least two conductive lines so as to form the testkey design pattern;

wherein each said source and each said drain is directly connected to each side of the portion of the one of the at least two conductive lines; and wherein each of said source and said drain has a first length.

2. The testkey design pattern of claim 1, wherein said first conductive contact comprises a material selected from the group consisting of silicon and metal.

3. The testkey design pattern of claim 1, wherein said conductive lines comprise a material selected from the group consisting of silicon and metal.

4. The testkey design pattern of claim 1, wherein said second conductive contact comprises a material selected from the group consisting of silicon and metal.

5. The testkey design pattern of claim 1, wherein the ratio of said first width and said first length is less than 5.

6. The testkey design pattern of claim 1, wherein in said electronic device said source and drain are symmetrically connected to each side of said conductive lines.

7. The testkey design pattern of claim 1, wherein n equals to m.

8. The testkey design pattern of claim 1, wherein n is greater than 2.

9. The testkey design pattern of claim 1, wherein said first length is between 0.2-7 μm.

10. The testkey design pattern of claim 1, wherein said first length×said first width×m×n is greater than 100 μm2.

* * * * *